(12) United States Patent
Schulze et al.

(10) Patent No.: US 7,759,761 B2
(45) Date of Patent: Jul. 20, 2010

(54) SEMICONDUCTOR WAFER SUBSTRATE FOR POWER SEMICONDUCTOR COMPONENTS AND METHOD FOR PRODUCING THE SAME

(75) Inventors: Hans-Joachim Schulze, Ottobrunn (DE); Helmut Strack, Munich (DE)

(73) Assignee: Infineon Technologies Austria AG, Villach (AT)

( * ) Notice: Subject to any disclaimer, the term of this patent is extended or adjusted under 35 U.S.C. 154(b) by 633 days.

(21) Appl. No.: 11/613,253

(22) Filed: Dec. 20, 2006

(65) Prior Publication Data

US 2007/0148422 A1 Jun. 28, 2007

(30) Foreign Application Priority Data

Dec. 20, 2005 (DE) .................. 10 2005 061 263

(51) Int. Cl.
*H01L 29/06* (2006.01)
(52) U.S. Cl. .................. 257/502; 257/625; 257/E23.153
(58) Field of Classification Search .................. 257/502, 257/625, E23.153
See application file for complete search history.

(56) References Cited

U.S. PATENT DOCUMENTS

| | | | |
|---|---|---|---|
| 3,925,808 A | 12/1975 | Rai-Choudhury | 357/67 |
| 4,881,115 A * | 11/1989 | Lesk et al. | 257/590 |
| 4,954,870 A | 9/1990 | Takemura et al. | 357/67 |
| 5,138,439 A | 8/1992 | Kobiki | 357/80 |
| 5,831,309 A | 11/1998 | Englisch et al. | 257/347 |
| 6,773,995 B2 * | 8/2004 | Shin et al. | 438/270 |
| 7,078,353 B2 * | 7/2006 | Daval et al. | 438/763 |

FOREIGN PATENT DOCUMENTS

| | | |
|---|---|---|
| DE | 4010370 C2 | 5/1995 |
| DE | 4420024 A1 | 12/1995 |
| DE | 10140826 A1 | 7/2002 |
| DE | 102004054147 A1 | 2/2006 |
| DE | 102004052153 A1 | 4/2006 |
| DE | 102005030466 A1 | 1/2007 |
| EP | 1085561 A1 | 3/2001 |

\* cited by examiner

*Primary Examiner*—Lex Malsawma
(74) *Attorney, Agent, or Firm*—Coats & Bennett, P.L.L.C.

(57) ABSTRACT

In a semiconductor wafer substrate (20) for power semiconductor components (1) and in a method for producing the same, the semiconductor wafer substrate (20) has a large-area, buried rear side electrode (3) in form of a layer arranged between a self-supporting wafer substrate (4) and a non-self-supporting monocrystalline silicon wafer layer (5) arranged on the rear side electrode (3). The rear side electrode (3) has a ternary carbide and/or a ternary nitride and/or carbon.

29 Claims, 4 Drawing Sheets

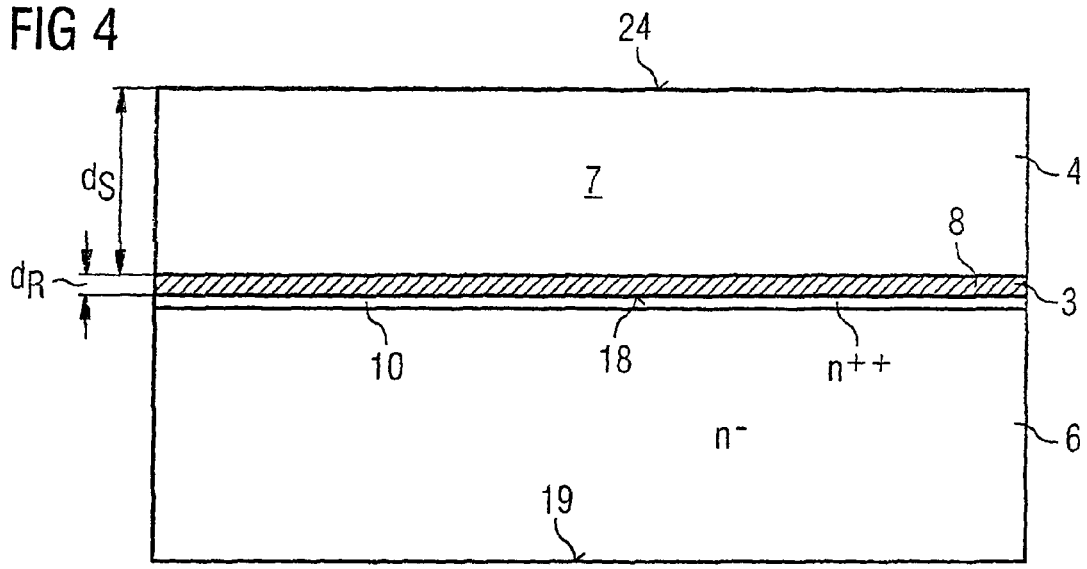
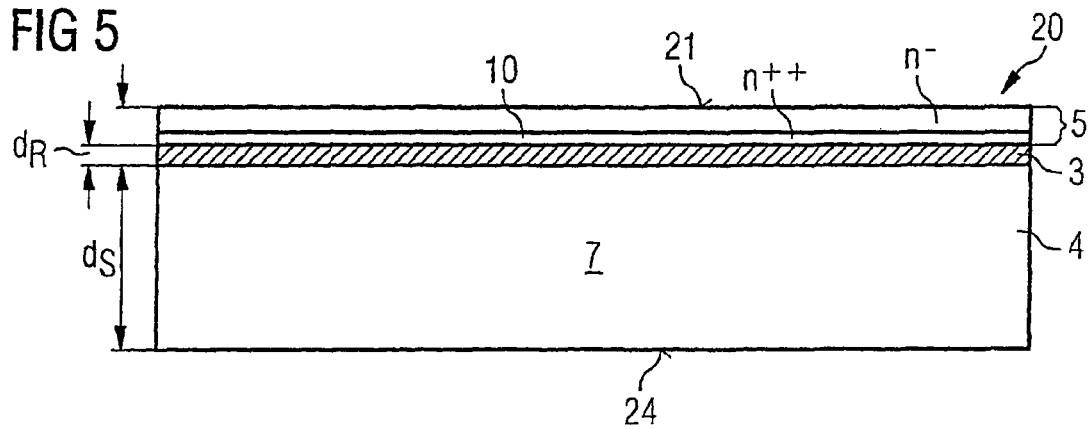
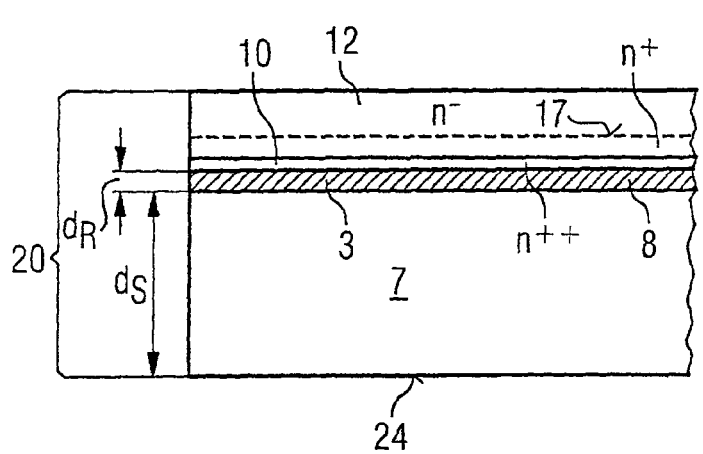
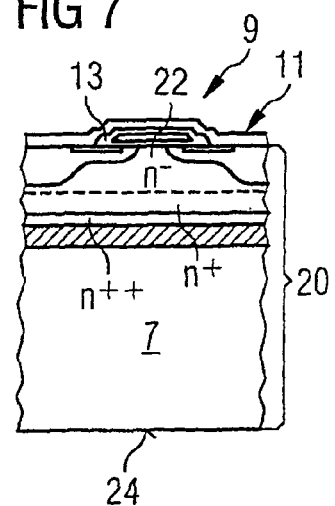

SEMICONDUCTOR WAFER SUBSTRATE FOR POWER SEMICONDUCTOR COMPONENTS AND METHOD FOR PRODUCING THE SAME

RELATED APPLICATION

This application claims priority from German Patent Application No. DE 10 2005 061 263.6, which was filed on Dec. 20, 2005, and is incorporated herein by reference in its entirety.

TECHNICAL FIELD

The invention relates to a semiconductor wafer substrate for power semiconductor components and to a method for producing the same. In particular, the invention relates to semiconductor wafers thinned in such a way that they are no longer self-supporting, or thinned semiconductor chips such as are described in the patent application DE 10 2004 054 147. Thinned semiconductor wafers or thinned semiconductor chips of this type are used for power diodes, field effect power transistors and other semiconductor components in order, by way of example, to decrease the contact resistance. Moreover, thinned semiconductor wafers or thinned semiconductor chips of this type are used for semiconductor modules in order to drastically reduce the semiconductor component height.

BACKGROUND

Both in the context of fabrication and in the context of handling, these thinned semiconductor wafers or thinned semiconductor chips have considerable disadvantages since they are mechanically jeopardized and nevertheless have to be provided with wiring structures on their top sides and contact layers on their rear sides. As described in the patent application DE 10 2004 054 147, for fabrication and handling the semiconductor wafers or semiconductor chips are fixed onto intermediate carriers in order to absorb the loadings that occur during handling and fabrication.

One disadvantage of fixing on an intermediate carrier is the additional fabrication outlay in fitting and removing the intermediate carrier, which not only may be associated with the contamination of the high-purity semiconductor material with contaminants by the material of the intermediate carrier, but also is associated with an increased risk of breaking for the thinned semiconductor wafer or the thinned semiconductor chip.

In order to combat this risk of breaking, it is necessary even for thinned semiconductor wafers to have a minimum thickness in order to be able to produce self-supporting semiconductor chips therefrom and process them further, even though the active region in many cases makes up only a fraction of the semiconductor chip thickness. The requirement in the case of power semiconductor wafers for depositing suitable monocrystalline silicon epitaxial layers on a self-supporting monocrystalline silicon substrate also requires a minimum thickness of the silicon substrate. This is associated with the additional disadvantage that an increased minimum source resistance has to be accepted in the case of power semiconductor components and hitherto has not been able to be reduced any further.

In this respect, FIG. 9 shows a schematic cross section through a power semiconductor chip 11 of a conventional power semiconductor component 2. A power semiconductor component of this type is constructed on a highly conductive monocrystalline silicon substrate 6 and has, on the top side 19 of the monocrystalline silicon substrate, a silicon layer 12 adapted to the requirements of the power semiconductor device for a corresponding drift path. A gate-source structure 13 is introduced in the upper region of the epitaxial layer 12, which structure, for its part, influences the total on-state resistance of a power semiconductor device of this type through the series connection of the resistances $R_M$ as metal resistance of the source metallization, $R_S$ as source resistance, $R_C$ as channel resistance in a body zone 23 and also $R_J$ as pn junction resistance.

A not insignificant portion of the total on-state resistance is contributed by the resistance $R_e$ of the pure epitaxial material of the drift path. A considerable proportion is added to this by the series connection of the source resistance $R_S$, which, in accordance with the explanations above, is unavoidable even in the case of thinned self-supporting monocrystalline semiconductor wafers. By contrast, the contribution of the rear side electrode 3 on the rear side of the monocrystalline silicon substrate 6 is negligibly small in comparison with the above-mentioned series resistances that determine the on-state resistance of the power semiconductor component 2.

However, such rear side metallizations restrict the thermal application range of the power semiconductor elements since they tend toward migration and toward reaction with the semiconductor material with the formation of spikes, so that the theoretical limit of the thermal loadability of a semiconductor material, such as silicon, may in part not be fully exhausted. Moreover, thermal process steps after a metallization are restricted to low temperatures by the metal materials, which is associated with the disadvantage that hitherto metallization processes in semiconductor technology have, in principle, been permitted to be used only in the final phase of component production. The tendency of metals to occupy low impurity levels in the band gap range in the case of undesired indiffusion into the semiconductor wafers can also distort the properties of the semiconductor structures.

SUMMARY

A semiconductor wafer substrate may have an improved thermal stability and the thermal and/or mechanical loadability of which can be improved and the electrical conductivity of may surpass the conductivity of conventional highly doped silicon substrates without restricting the capability of providing monocrystalline silicon epitaxial layers on the semiconductor wafer substrate.

In an embodiment, a semiconductor wafer substrate for power semiconductor components may comprise a large-area rear side electrode in form of a layer, the rear side electrode being arranged in a manner buried between a self-supporting wafer substrate and a non-self-supporting monocrystalline silicon wafer layer arranged on the rear side electrode.

BRIEF DESCRIPTION OF THE DRAWINGS

The invention will now be explained in more detail with reference to the accompanying figures.

FIGS. 1 to 5 show schematic cross sections through components for producing a semiconductor wafer substrate;

FIG. 1 shows a schematic cross section through a monocrystalline silicon wafer;

FIG. 2 shows a schematic cross section through the silicon wafer in accordance with FIG. 1 after the application of a rear side structure;

FIG. 3 shows a schematic cross section through the silicon wafer in accordance with FIG. 2 after the application of a rear side electrode;

FIG. 4 shows a schematic cross section through the silicon wafer in accordance with FIG. 3 after the application of a self-supporting wafer substrate;

FIG. 5 shows a schematic cross section through a semiconductor wafer substrate after the thinning of the silicon wafer in accordance with FIG. 4;

FIG. 6 shows a schematic cross section through the semiconductor wafer substrate in accordance with FIG. 5 after the application of a silicon layer;

FIG. 7 shows a schematic cross section through the semiconductor wafer substrate in a semiconductor chip position after the application of a circuit arrangement;

DETAILED DESCRIPTION

Figure 1:
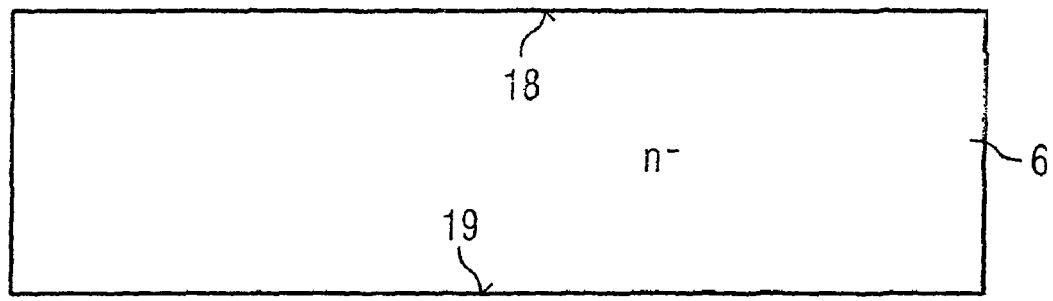

According to an embodiment, a semiconductor wafer substrate for power semiconductor components may have a large-area rear side electrode in form of a layer, the rear side electrode being arranged in a manner buried between a self-supporting wafer substrate and a non-self-supporting monocrystalline silicon wafer layer arranged on the rear side electrode.

A semiconductor wafer substrate of this type has the advantage that the proportion of semiconductor material is reduced to a minimum, so that the on-state resistances of power semiconductor components which are fabricated from a semiconductor wafer substrate of this type can be correspondingly minimized. In order nevertheless to ensure that the semiconductor wafer substrate is self-supporting, according to an embodiment, a rear side electrode and additionally a self-supporting wafer substrate are situated on the rear side of a non-self-supporting monocrystalline silicon wafer layer.

According to an embodiment, the wafer substrate can now be produced from different materials, especially as the buried rear side electrode guarantees a low on-state resistance, so that the wafer substrate itself merely has to have a high stability. On the other hand, according to an embodiment, it is advantageous if the self-supporting wafer substrate has a coefficient of thermal expansion adapted to the non-self-supporting monocrystalline silicon layer, in order to ensure that no microcracks are injected in the non-self-supporting monocrystalline silicon wafer layer in the event of thermal loading.

On the other hand, it is known that the silicon is significantly more flexible in the case of extremely thin non-self-supporting monocrystalline silicon wafer layers than in the case of the customary semiconductor wafer thicknesses, so that it can be assumed that with regard to the tolerance of the coefficients of expansion of the material of the rear side electrode and of the material of the wafer substrate, a larger bandwidth is permissible without initiating serious defects in the monocrystalline silicon wafer layer.

According to an embodiment, the non-self-supporting crystalline silicon wafer layer has a thinned silicon wafer, the self-supporting wafer substrate has an undoped or doped polysilicon and/or a carbon, and the buried rear side electrode has a high-temperature-resistant electrically conductive material. The high temperature resistance of the electrically conductive material of the rear side electrode is desired since the stabilizing polysilicon or carbon layer is deposited at relatively high temperatures of e.g. 800° C. to 1000° C.

According to an embodiment, the non-self-supporting monocrystalline silicon wafer layer preferably has semiconductor chip positions arranged in rows and columns. Moreover, according to an embodiment, the rear side of said monocrystalline silicon wafer layer has a rear side structure of a power semiconductor chip in the semiconductor chip positions, a p-conducting emitter of an IGBT, an n-conducting emitter of a diode and/or a field stop zone or a drain zone of a MOSFET preferably being provided as the rear side structure of the non-self-supporting monocrystalline silicon wafer layer.

In a further embodiment of the semiconductor wafer substrate, the monocrystalline silicon wafer layer has on its top side a weakly to medium doped silicon layer, in which are arranged drift zones and/or charge carrier compensation zones and/or field plate structures and/or gate and source structures of power semiconductor chips in semiconductor chip positions. As a result, on the semiconductor wafer substrate according to an embodiment, it is already possible to provide a complete structure of a power semiconductor chip in each of the semiconductor chip positions.

According to an embodiment, it is furthermore provided that the buried rear side electrode of the semiconductor wafer substrate has a ternary carbide and/or a ternary nitride and/or carbon. This rear side electrode material has the advantage that not only does it have a high electrical conductivity and correspondingly also a high thermal conductivity, but it also has a high melting point, so that the silicon layer deposition that is to be carried out at elevated temperature can be carried out in exactly the same way as diffusion and implantation steps for the patterning of power semiconductor chips in semiconductor chip positions of the semiconductor wafer substrate.

According to an embodiment, it is furthermore provided that the rear side electrode has a donor ion concentration and/or acceptor ion concentration that increases the electrical conductivity at the operating temperature of a power semiconductor chip. This holds true particularly if the rear side electrode is constructed from a carbon, since donor atoms and acceptor atoms can be introduced in the carbon, which then significantly increase the conductivity of the carbon at elevated temperature.

According to an embodiment, the buried rear side electrode preferably has a thickness $d_R$ in micrometers of 0.5 $\mu m \leq d_R \leq 10$ $\mu m$. With this thickness, the buried rear side electrode completely fulfills the ohmic linking to superordinate circuit carriers and significantly reduces the on-state resistance that occurs in the case of the power semiconductor chips to be formed. It is furthermore provided that the self-supporting wafer substrate made of polysilicon or carbon has a thickness $d_S$ of 50 $\mu m \leq d_S \leq 200$ $\mu m$.

According to an embodiment, it is provided that the self-supporting wafer substrate has through contacts which are electrically connected to the buried rear side electrode. According to an embodiment, the through contacts can be produced e.g. by etching trenches into the wafer substrate which reach as far as the high-temperature-resistant metallization, and by then filling said trenches with a layer having very good conductivity. According to an embodiment, through contacts of this type may be arranged in a manner distributed uniformly on the semiconductor wafer substrate rear side, and may also have lattice structures. According to an embodiment, it is also possible for said through contacts not to be introduced into the material of the self-supporting wafer substrate until after the high-temperature processes. According to an embodiment, a further possibility consists in providing an ohmic connection between the buried rear side electrode and a superordinate circuit carrier after the separation of the self-supporting wafer substrate by metallizing the edge sides of the power semiconductor chips.

According to an embodiment, the buried rear side electrode preferably has three-component systems having, alongside the elements carbon and nitrogen, an element from the group of the transition metals Cs, Ti, Cr, V, Zr, Nb, Mo, Hf and/or Ta. The three-component systems comprising carbon, nitrogen and transition metals enable a surprisingly low resistivity in conjunction with a high operating temperature.

According to an embodiment, it is furthermore provided that the buried rear side electrode has three-component systems having, alongside the elements carbon and nitrogen, semiconducting elements from the group Al, Si, P, S, Ga, Ge, As, Cd, In, Sn, Te and/or Pb. These three-component systems with semiconducting elements also give rise in part to compounds that have a high melting point and are highly temperature-resistant and also highly conductive for the buried rear side electrode.

According to an embodiment, in the case of the three-component systems it is preferable for them to have a 2-1-1 type, such as $Ti_2AlC$, or the 3-1-2 type, such as $Ti_3AlC_2$, or the 4-1-3 type, such as $Ti_4AlN_3$. All these three-component systems are suitable as materials for the buried rear side electrode. Just 40 carbides having the 2-1-1 composition which are appropriate for the application according to an embodiment are known. Ten such solid and stable ternary compounds of the 2-1-1 type exist in the case of the nitrides.

According to an embodiment, the carbon that can be used both for the rear side electrode and for the wafer substrate may be present as amorphous carbon or as crystalline carbon in the form of graphite, and may also have mixed forms thereof. According to an embodiment, the conductive and temperature-resistant material for the rear side electrode has a donor ion concentration and/or acceptor ion concentration that increases the electrical conductivity at operating temperature.

As the temperature increases, the ionization of such donor ion concentrations and/or acceptor ion concentrations that increase the electrical conductivity becomes greater, so that the material seeded with donor atoms or acceptor atoms at substitution lattice sites releases surplus charge carriers of the substitutional donor atoms or acceptor atoms as the temperature increases and this establishes an increasing degree of ionization with correspondingly freely mobile electrons and/or holes in the lattice of the ternary compound crystals.

In a further embodiment, the buried rear side electrode preferably has a pyrolytically deposited carbon and/or a pyrolytically deposited ternary carbide and/or a pyrolytically deposited ternary nitride. The pyrolytic deposition of such materials has the advantage of forming a conductive and highly temperature-resistant layer on the rear side of the monocrystalline silicon layer.

According to an embodiment, from the many possible ternary compounds for the buried rear side electrode, in particular the ternary carbides of the compounds $Ti_3SiC_2$, $Ti_4SiC_3$, $Ti_3GeC_2$, $Ti_2GeC$, $Ti_3AlC_2$, $Ti_2AlC$, $Hf_2PbC$, $Nb_2AlC$, $Ta_2GaC$, $Zr_2SnC$ have proved worthwhile. From the ternary nitrides, the compounds $Ti_2AlN$, $Ti_2GaN$, $Cr_2GaN$ are preferably used.

According to an embodiment, from a semiconductor wafer substrate of this type, it is possible to produce power semiconductor components having at least one semiconductor chip, the semiconductor chip having at least one large-area rear side electrode in form of a layer arranged in a manner buried between a self-supporting substrate and a non-self-supporting monocrystalline silicon layer arranged on the rear side electrode.

In this case, the monocrystalline silicon layer belongs to a thinned monocrystalline silicon chip which, in the thinned state, is no longer self-supporting, while the self-supporting substrate may be an undoped or doped polysilicon or a carbon. By contrast, the buried rear side electrode is a high-temperature-resistant electrically conductive material comprising the preferably ternary carbides or nitrides specified above. In the case of these power semiconductor components, the non-self-supporting monocrystalline silicon layer has a rear side structure of a power semiconductor chip, preferably a p-conducting emitter of an IGBT, an n-conducting emitter and/or a field stop zone or a drain zone of a MOSFET. According to an embodiment, preferably power semiconductor components such as MOSFETs, IGBTs, JFETs, $PN^-N$ diodes or Schottky diodes can be realized from this semiconductor wafer substrate.

According to an embodiment, a method for producing a semiconductor wafer substrate has the following method steps. The first step involves producing a monocrystalline silicon wafer having a multiplicity of semiconductor chip positions arranged in rows and columns, the rear side of the silicon wafer having a rear side structure of a power semiconductor chip in the semiconductor chip positions. These are preferably a p-conducting emitter of an IGBT, an n-conducting emitter of a diode and/or a field stop zone or a drain zone of a MOSFET or dopant concentrations suitable for planar ohmic junctions in regions near the rear side. A rear side electrode is deposited on these rear side regions of the monocrystalline silicon wafer that are structured in this way, the material of the rear side electrode being a ternary carbide and/or a ternary nitride and/or carbon. A wafer substrate is applied to said rear side electrode.

According to an embodiment, afterward, the monocrystalline silicon wafer is thinned from the top side of the silicon wafer to form a non-self-supporting monocrystalline silicon wafer layer. As a result, a semiconductor wafer substrate is practically available which has only a small or minimal proportion of semiconductor material in the form of the monocrystalline silicon wafer layer. All the remaining materials are either highly conductive or highly stable in order to ensure a self-supporting wafer substrate in conjunction with low-resistance linking of the monocrystalline silicon semiconductor material to a superordinate circuit board.

According to an embodiment, the deposition of a conductive rear side electrode onto the rear side of the semiconductor wafer is effected by means of pyrolysis, by means of sputtering, vapor deposition or by means of chemical vapor deposition (CVD). These methods make it possible to simultaneously provide a multiplicity of semiconductor wafer rear sides with a corresponding large-area high-temperature-resistant electrode. For the application of a wafer substrate to the rear side electrode, a polysilicon or a graphite layer may be deposited on the rear side electrode. Said layers have the advantage that they correspond in terms of their thermal expansion behavior approximately to the monocrystalline silicon. According to an embodiment, another possibility for applying a wafer substrate to the rear side electrode consists in joining a semiconductor wafer to the rear side electrode. According to an embodiment, solder materials having an extremely high melting point are used for the joining process. A semiconductor wafer arranged thereon in any case supplies the necessary self-supporting stability for the semiconductor wafer substrate.

According to an embodiment, finally, it can be provided that trench structures are introduced into the wafer substrate for through contacts to the buried rear side electrode and are filled with an electrically conductive material. According to an embodiment, this filling may also take place later if the electrically conductive material comprises components having a low melting point. However, if components having a high melting point are used for said through contacts, then the introduction of the through contacts may take place as early as at the wafer level.

According to an embodiment, a method for producing a power semiconductor chip has the following additional method steps. After the thinning of the silicon wafer from the top side to form a monocrystalline silicon wafer layer, a silicon layer likewise made of monocrystalline silicon can then be deposited as required, particularly in the case of compensation components, onto said monocrystalline silicon wafer layer. Corresponding circuit structures can be introduced into the thinned silicon layer or said silicon layer in the individual semiconductor chip positions in regions near the surface. Finally, semiconductor structures, wiring structures and insulation layers are applied to the crystalline silicon layer or silicon layer in the semiconductor chip positions.

To summarize, a high-temperature-resistant and highly conductive layer is produced on the rear side of a monocrystalline semiconductor wafer, a wafer substrate being applied on said layer, with the result that a buried, highly conductive and temperature-resistant layer is available between the wafer substrate and a thin non-self-supporting monocrystalline silicon layer after extreme thinning of the semiconductor wafer.

This makes it possible to produce the monocrystalline silicon layer containing active component structures in extremely thin fashion and nevertheless to carry out the processes required for producing the component structures on the front side even at high temperatures. The use of the semiconductor wafer substrate according to an embodiment thus enables a reduction of the on resistance and improved heat dissipation for power semiconductor components. What is also advantageous in the case of this embodiment is that spiking or migration effects can be largely precluded on account of the high temperature resistance of the highly conductive layer.

FIG. 1 shows a schematic cross section through a monocrystalline silicon wafer 6 having a top side 19 and a rear side 18. Said rear side 18 has semiconductor chip positions which are arranged in rows and columns and which are to be provided with a corresponding rear side structure.

Figure 2:
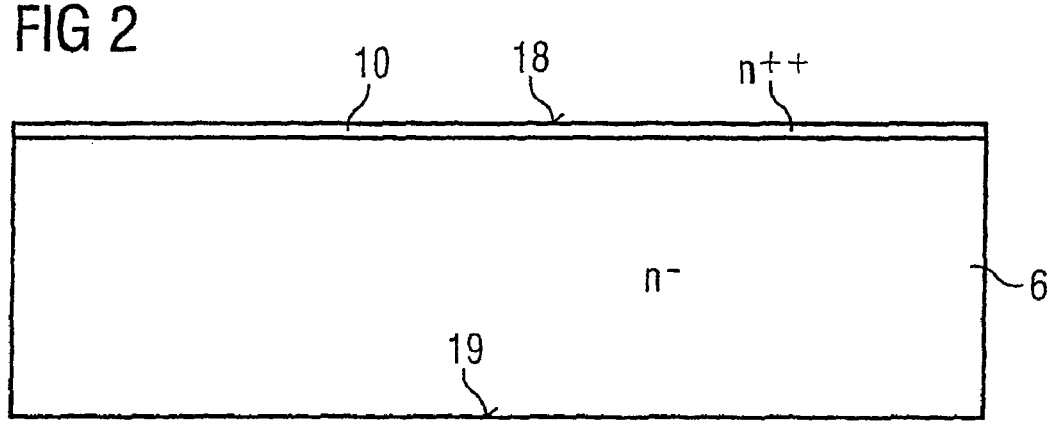

FIG. 2 shows a schematic cross section through the silicon wafer 6 in accordance with FIG. 1 after the introduction of a rear side structure 10 into the rear side 18 of the silicon wafer 6. Said rear side structure 10 in the semiconductor chip positions depends on the power semiconductor chip to be produced, preferably a p-conducting emitter of an IGBT (isolated gate bipolar transistor), an n-conducting emitter of a diode and/or a field stop zone or a drain zone of a MOSFET being realized.

Said rear side structure 10 may e.g. also be produced by implanting impurities from the rear side and subsequently positioning them by means of heat treatment on substitutional lattice sites in order to provide a suitable dopant concentration in regions near the rear side for an ohmic contact junction with a metal. In the case of the embodiment shown here, the rear side structure 10 is realized by providing a high $n^{++}$-conducting layer in the semiconductor chip positions by introducing impurities. A rear side structure that is highly doped in this way improves the ohmic contact with the rear side electrode to be applied in the subsequent fabrication step.

Figure 3:
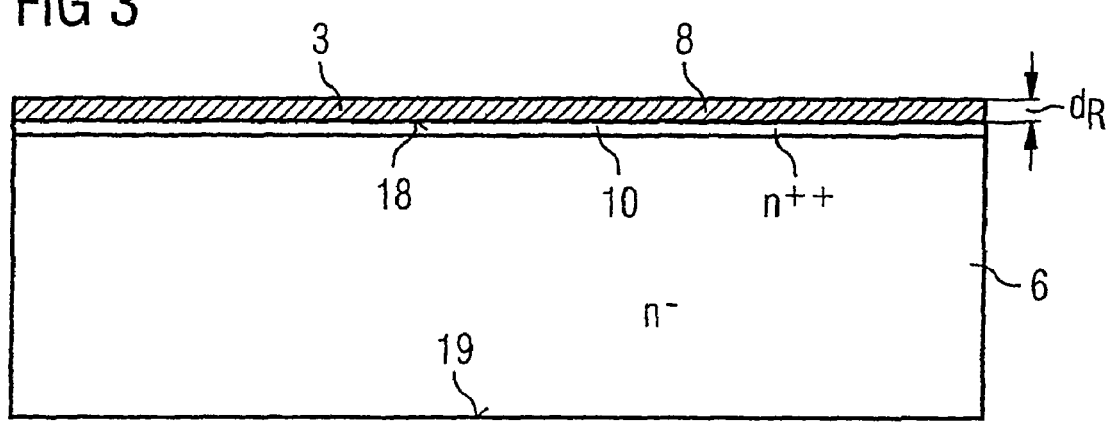

FIG. 3 shows a schematic cross section through the silicon wafer 6 in accordance with FIG. 2 after the application of a rear side electrode 3. Said rear side electrode 3 has a high-temperature-resistant and highly conductive material 8, which preferably has ternary carbides and/or ternary nitrides. In particular, said rear side electrode 8 may have, from the 40 possible carbides, the carbides $Ti_3SiC_2$, $Ti_4SiC_3$, $Ti_3GeC_2$, $Ti_2GeC$, $Ti_3AlC_2$, $Ti_2AlC$, $Hf_2PbC$, $Nb_2AlC$, $Ta_2GaC$ and/or $Zr_2SnC$.

From the possible 10 ternary nitrides which meet the prerequisites of a high temperature resistance and a high electrical conductivity, the compounds $Ti_2AlN$, $Ti_2GaN$ and/or $Cr_2GaN$ are preferably used for the rear side electrode 3. In order to ensure the electrical conductivity for a later power semiconductor device and to increase it compared with conventional power semiconductor devices, the rear side electrode 3 has a thickness $d_R$ in micrometers of $0.5\ \mu m \leq d_R \leq 10\ \mu m$. This enables a significantly improved forward current through the power semiconductor components with reduced heat loss.

However, this applied rear side electrode 3 is not self-supporting, so that the total resistance is still determined by the relatively thick monocrystalline silicon wafer 6. Therefore, a substrate wafer is applied in the subsequent step, which substrate wafer is intended to ensure the mechanical stability and to enable the monocrystalline silicon wafer 6 to be reduced in its thickness to a minimum to form a monocrystalline silicon wafer layer.

FIG. 4 shows a schematic cross section through the silicon wafer 6 in accordance with FIG. 3 after the application of a self-supporting wafer substrate 4. In this embodiment, the wafer substrate 4 has as self-supporting material a polysilicon 7 which can be deposited in undoped or doped fashion on the rear side electrode 3 with a thickness $d_S$ of $50\ \mu m \leq d_S \leq 200\ \mu m$. This thickness of the polysilicon 7 ensures that a wafer substrate 4 of this type is self-supporting and remains dimensionally stable.

Instead of polysilicon, it is also possible to deposit pyrolytic graphite on the rear side electrode 3, said graphite, like polysilicon, having the advantage that its conductivity can be improved by corresponding addition of dopants, said conductivity increasing as the thermal loading of a power semiconductor component increases since donor impurities and acceptor impurities can be increasingly ionized at an increasing temperature. Since the applied wafer substrate 4 is self-supporting, the monocrystalline semiconductor material of the silicon wafer 6 can then be thinned to a small thickness of a few micrometers. However, thicknesses of up to 200 μm are also conceivable.

FIG. 5 shows a schematic cross section through a semiconductor wafer substrate 20 after the thinning of the silicon wafer 6 in accordance with FIG. 4. All that remains of the original silicon wafer 6 is now a monocrystalline silicon wafer layer 5, which on the one hand has the rear side structure 10 and on the other hand has a residue of the original semiconductor material. Said monocrystalline silicon layer 5 together with the buried rear side electrode 3 and the self-supporting wafer substrate 4 forms a new semiconductor wafer substrate 20 for producing power semiconductor components with an extremely low on-state resistance.

Said low on-state resistance is essentially ensured by the rear side electrode 3 made preferably of ternary carbides and/or ternary nitrides. In order to reduce the on-state resistance further, it is possible to introduce through contacts having highly conductive material into the self-supporting wafer substrate 4. If said highly conductive material is high-temperature-resistant, this can already be carried out with the semiconductor wafer substrate 20 present in FIG. 5. However, if said electrically conductive material has a low melting point, the through contacts cannot be introduced into the self-supporting wafer substrate 4 until at the end of the process for producing power semiconductor chips. Finally, it is also possible, after the semiconductor wafer substrate 20 has been separated into individual power semiconductor chips, to metallize the edge sides of the power semiconductor chips and thereby to produce a low-resistance connection to a superordinate circuit carrier.

FIG. 6 shows a schematic cross section through the semiconductor wafer substrate 20 in accordance with FIG. 5 after the application of a silicon layer 12. Since the semiconductor wafer substrate 20 has a monocrystalline thin silicon wafer layer 5 on its top side or on the rear side electrode 8, it is possible to cause monocrystalline silicon to grow epitaxially onto the top side 17 of said monocrystalline silicon wafer layer 5, with a dopant concentration that is crucial for a power semiconductor component. In this embodiment, an n⁻-conducting silicon layer 12 is applied in each of the semiconductor chip positions of the semiconductor wafer substrate 20.

FIG. 7 shows a schematic cross section through the semiconductor wafer substrate 20 in a semiconductor chip position 9 after the application of a circuit arrangement 22. Said semiconductor chip position 9 shows the basic construction of a circuit arrangement 22 which is partly introduced into the monocrystalline silicon layer 12 and is partly applied to the monocrystalline silicon layer 12.

Figure 8:
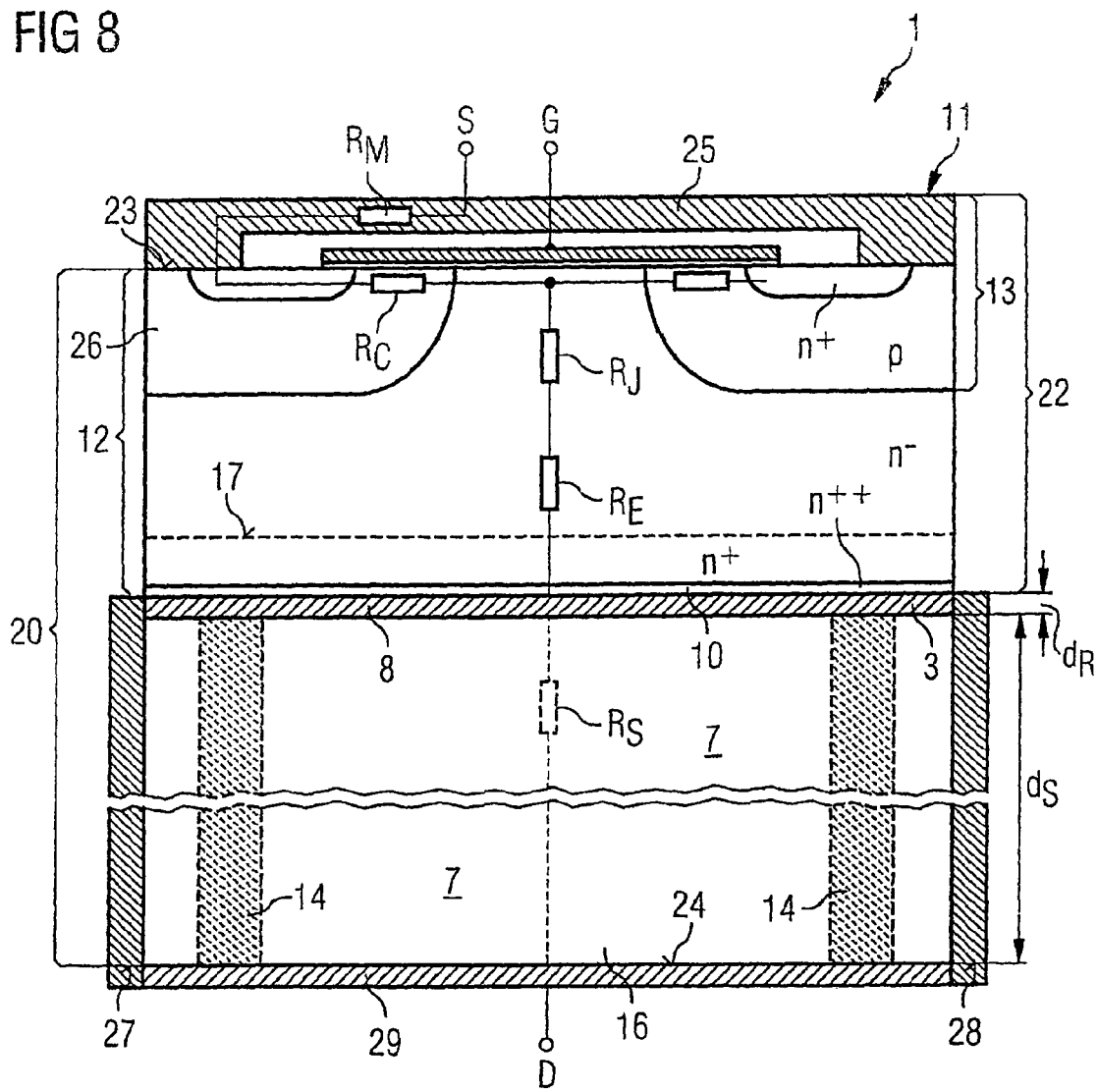
FIG. 8 shows a schematic cross section through a power semiconductor chip of a power semiconductor component in accordance with one embodiment.
Figure 9:
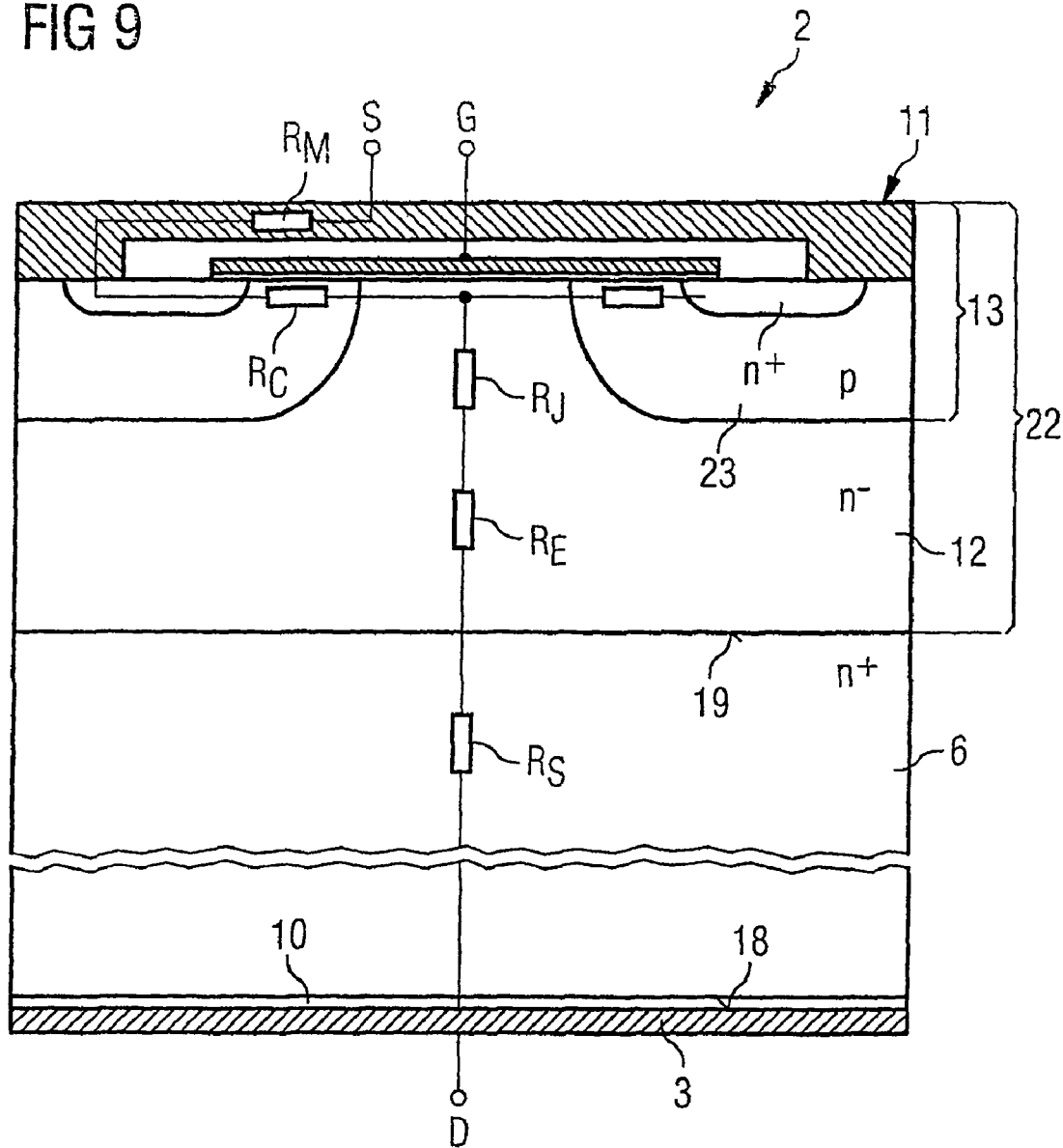
FIG. 9 shows a schematic cross section through a power semiconductor chip of a conventional power semiconductor component.

FIG. 8 shows a schematic cross section through a power semiconductor chip 11 of a power semiconductor component 1 in accordance with one embodiment. This embodiment represents a zone of a vertical power semiconductor component having a source-gate structure 13 which has a source terminal S and a gate terminal G on the top side 23 of a semiconductor body and has a drain terminal D on the rear side 24 of the semiconductor wafer substrate 20.

Furthermore, the individual resistances which in total form the on-state resistance of the power semiconductor component 1 are presented symbolically in the structure of a power semiconductor component 1 as shown in FIG. 8. In the source-gate structure 13, the on-state resistance is determined by the series connection of the source zone $R_S$, the metal resistance $R_M$ of the source electrode 25, the channel resistance $R_C$ of the channel region in the body zone 26 and the pn junction resistance $R_J$.

This is followed by the resistance of the monocrystalline silicon layer 12 and also the resistance of the highly doped monocrystalline drain zone. The original source resistance $R_S$ is now determined by the highly conductive buried rear side electrode 3, the adjacent lateral contact-connections 27 and 28 and/or by corresponding through contacts 14 made of metal. Furthermore, a rear side coating 29 on the rear side 24 of the substrate 16 can moreover significantly reduce the total on-state resistance of the power semiconductor component 1. The exemplary embodiments above are not restricted to silicon, but rather may also be embodied with compound semiconductors, in particular with IV/IV compound semiconductors such as SiC or SiGe.

LIST OF REFERENCE SYMBOLS

1 Power semiconductor component
2 Power semiconductor component
3 Rear side electrode
4 Self-supporting wafer substrate
5 Silicon wafer layer
6 Silicon wafer
7 Polysilicon
8 High-temperature-resistant semiconductor material
9 Semiconductor chip position
10 Rear side structure
11 Power semiconductor chip
12 Silicon layer
13 Gate and source structure
14 Through contact
16 Substrate
17 Top side of the monocrystalline silicon layer
18 Rear side of the silicon wafer
19 Top side of the silicon wafer
20 Semiconductor wafer substrate
22 Circuit structure
23 Top side of a semiconductor body
24 Rear side of the semiconductor wafer substrate
25 Source electrode
26 Body zone
27 Lateral contact
28 Lateral contact
29 Rear side coating
$d_R$ Thickness of the buried rear side electrode
$d_S$ Thickness of the self-supporting wafer substrate
$R_C$ Channel resistance
$R_J$ pn junction resistance
$R_E$ Epitaxial resistance
$R_M$ Metallization resistance
$R_S$ Source resistance
D Drain terminal
G Gate terminal
S Source terminal

What is claimed is:

1. A semiconductor wafer substrate for power semiconductor components comprising a large-area rear side electrode in form of a layer, the rear side electrode being arranged in a manner buried between a self-supporting wafer substrate and a non-self-supporting monocrystalline silicon wafer layer arranged on the rear side electrode, wherein the buried rear side electrode comprises at least one of a ternary carbide, a ternary nitride or carbon.

2. The semiconductor wafer substrate according to claim 1, wherein the monocrystalline silicon wafer layer has a thinned silicon wafer, the self-supporting wafer substrate has undoped or doped polysilicon and the buried rear side electrode has a high-temperature-resistant electrically conductive material.

3. The semiconductor wafer substrate according to claim 1, wherein the non-self-supporting monocrystalline silicon wafer layer has semiconductor chip positions arranged in rows and columns, and has a rear side structure of a power semiconductor chip in the semiconductor chip positions, preferably a p-conducting emitter of an IGBT, an n-conducting emitter of a diode and/or a field stop zone or a drain zone of a MOSFET.

4. The semiconductor wafer substrate according to claim 1, wherein the monocrystalline silicon wafer layer has on its top side a weakly to medium doped silicon layer, in which are arranged drift zones and/or charge carrier compensation zones and/or field plate structures and/or gate and source structures of power semiconductor chips in semiconductor chip positions.

5. The semiconductor wafer substrate according to claim 1, wherein the buried rear side electrode has a donor ion concentration and/or acceptor ion concentration that increases the electrical conductivity at the operating temperature of a power semiconductor chip.

6. The semiconductor wafer substrate according to claim 1, wherein the buried rear side electrode has a thickness $d_R$ of 0.5 µm $\leq d_R \leq$ 10 µm.

7. The semiconductor wafer substrate according to claim 1, wherein the self-supporting wafer substrate has a thickness $d_s$ of 50 µm $\leq d_s \leq$ 200 µm.

8. The semiconductor wafer substrate according to claim 1, wherein the self-supporting wafer substrate has through contacts which are electrically connected to the buried rear side electrode.

9. The semiconductor wafer substrate according to claim 1, wherein the buried rear side electrode has three-component systems having, alongside the elements carbon and nitrogen, an element from the group of the transition metals Cs, Ti, Cr, V, Zr, Nb, Mo, Hf and/or Ta.

10. The semiconductor wafer substrate according to claim 1, wherein the buried rear side electrode has three-component systems having, alongside the elements carbon and nitrogen, semiconducting elements from the group Al, Si, P, S, Ga, Ge, As, Cd, In, Sn, Te and/or Pb.

11. The semiconductor wafer substrate according to claim 1, wherein the buried rear side electrode has three-component systems of the 2-1-1 type, such as $Ti_2AlC$, or of the 3-1-2 type, such as $Ti_3AlC_2$, or of the 4-1-3 type, such as $Ti_4AlN_3$.

12. The semiconductor wafer substrate according to claim 1, wherein the buried rear side electrode has from the ternary carbides preferably the compounds $Ti_3SiC_2$, $Ti_4SiC_3$, $Ti_3GeC_2$, $Ti_2GeC$, $Ti_3AlC_2$, $Ti_2AlC$, $Hf_2PbC$, $Nb_2AlC$, $Ta_2GaC$, $Zr_2SnC$.

13. The semiconductor wafer substrate according to claim 1, wherein the buried rear side electrode has from the ternary nitrides preferably the compounds $Ti_2AlN$, $Ti_2GaN$, $Cr_2GaN$.

14. A power semiconductor component comprising at least one power semiconductor chip, the power semiconductor chip having at least one large-area rear side electrode in form of a layer arranged in a manner buried between a self-supporting wafer substrate and a non-self-supporting monocrystalline silicon layer arranged on the rear side electrode, wherein the buried rear side electrode comprises at least one of a ternary carbide, a ternary nitride or carbon.

15. The power semiconductor component according to claim 14, wherein the monocrystalline silicon layer has a thinned silicon chip, the self-supporting substrate has undoped or doped polysilicon and the buried rear side electrode has a high-temperature-resistant electrically conductive material.

16. The power semiconductor component according to claim 14, wherein the non-self-supporting monocrystalline silicon layer has a rear side structure of a power semiconductor chip, preferably a p-conducting emitter of an IGBT, an n-conducting emitter of a diode or a field stop zone or a drain zone of a MOSFET.

17. The power semiconductor component according to claim 14, wherein the monocrystalline silicon layer has on its top side a weakly to medium doped silicon layer, in which are arranged drift zones and/or charge carrier compensation zones and/or field plate structures and/or gate and source structures of power semiconductor chips in semiconductor chip positions.

18. The power semiconductor component according to claim 14, wherein the buried rear side electrode has a donor ion concentration and/or acceptor ion concentration that increases the electrical conductivity at the operating temperature of a power semiconductor chip.

19. The power semiconductor component according to claim 14, wherein the buried rear side electrode has a thickness $d_R$ of 0.5 µm $\leq d_R \leq$ 10 µm.

20. The power semiconductor component according to claim 14, wherein the self-supporting substrate has a thickness $d_s$ of 50 µm $\leq d_s \leq$ 200 µm.

21. The power semiconductor component according to claim 14, wherein the buried rear side electrode has three-component systems having, alongside the elements carbon and nitrogen, an element from the group of the transition metals Sc, Ti, Cr, V, Zr, Nb, Mo, Hf and/or Ta.

22. The power semiconductor component according to claim 14, wherein the buried rear side electrode has three-component systems having, alongside the elements carbon and nitrogen, semiconducting elements from the group Al, Si, P, S, Ga, Ge, As, Cd, In, Sn, Te and/or Pb.

23. The power semiconductor component according to claim 14, wherein the buried rear side electrode has three-component systems of the 2-1-1 type, such as $Ti_2AlC$, or of the 3-1-2 type, such as $Ti_3AlC_2$, or of the 4-1-3 type, such as $Ti_4AlN_3$.

24. The power semiconductor component according to claim 14, wherein the buried rear side electrode has from the ternary carbides preferably the compounds $Ti_3SiC_2$, $Ti_4SiC_3$, $Ti_3GeC_2$, $Ti_2GeC$, $Ti_3AlC_2$, $Ti_2AlC$, $Hf_2PbC$, $Nb_2AlC$, $Ta_2GaC$, $Zr_2SnC$.

25. The power semiconductor component according to claim 14, wherein the buried rear side electrode has from the ternary nitrides preferably the compounds $Ti_2AlN$, $Ti_2GaN$, $Cr_2GaN$.

26. The power semiconductor component according to claim 14, wherein the power semiconductor component is a power semiconductor component from the group MOSFET, IGBT, JFET, PN$^-$N diode or Schottky diode.

27. A semiconductor wafer substrate for power semiconductor components comprising a large-area rear side electrode in form of a layer, the rear side electrode being arranged in a manner buried between a self-supporting wafer substrate and a non-self-supporting monocrystalline silicon wafer layer arranged on the rear side electrode, wherein the monocrystalline silicon wafer layer comprises a thinned silicon wafer, the self-supporting wafer substrate comprises undoped or doped polysilicon and the buried rear side electrode comprises a high-temperature-resistant electrically conductive material.

28. A semiconductor wafer substrate for power semiconductor components comprising a large-area rear side electrode in form of a layer, the rear side electrode being arranged in a manner buried between a self-supporting wafer substrate and a non-self-supporting monocrystalline silicon wafer layer arranged on the rear side electrode, wherein the self-supporting wafer substrate has through contacts which are electrically connected to the buried rear side electrode.

29. A power semiconductor component comprising at least one power semiconductor chip, the power semiconductor chip having at least one large-area rear side electrode in form of a layer arranged in a manner buried between a self-supporting wafer substrate and a non-self-supporting monocrystalline silicon layer arranged on the rear side electrode, wherein the monocrystalline silicon layer comprises a thinned silicon chip, the self-supporting substrate comprises undoped or doped polysilicon and the buried rear side electrode comprises a high-temperature-resistant electrically conductive material.

* * * * *

UNITED STATES PATENT AND TRADEMARK OFFICE
CERTIFICATE OF CORRECTION

| | | |
|---|---|---|
| PATENT NO. | : 7,759,761 B2 | Page 1 of 1 |
| APPLICATION NO. | : 11/613253 | |
| DATED | : July 20, 2010 | |
| INVENTOR(S) | : H. Schulze et al. | |

It is certified that error appears in the above-identified patent and that said Letters Patent is hereby corrected as shown below:

On the Title page of the printed patent, under (30) Foreign Application Priority Data replace "Dec. 20, 2005   (DE) ...................................... 10 2005 061 263" with --Dec. 20, 2005   (DE) ...................................... 10 2005 061 263.6--

In Column 12, line 25 (Claim 24, line 4) of the printed patent, replace "$Hf_2\ PbC$" with --$Hf_2PbC$--

Signed and Sealed this
Fifth Day of April, 2011

David J. Kappos
*Director of the United States Patent and Trademark Office*